(12) United States Patent
Ma et al.

(10) Patent No.: US 12,170,287 B2
(45) Date of Patent: Dec. 17, 2024

(54) ARRAY SUBSTRATE, DISPLAY PANEL, AND DISPLAY DEVICE

(71) Applicants: Beijing BOE Technology Development Co., Ltd., Beijing (CN); BOE Technology Group Co., Ltd., Beijing (CN)

(72) Inventors: Yongda Ma, Beijing (CN); Yong Qiao, Beijing (CN); Jianbo Xian, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 789 days.

(21) Appl. No.: 17/418,811

(22) PCT Filed: Dec. 9, 2020

(86) PCT No.: PCT/CN2020/134883
§ 371 (c)(1),
(2) Date: Jun. 26, 2021

(87) PCT Pub. No.: WO2021/121095
PCT Pub. Date: Jun. 24, 2021

(65) Prior Publication Data
US 2022/0181355 A1    Jun. 9, 2022

(30) Foreign Application Priority Data
Dec. 19, 2019   (CN) .......................... 201922301533.4

(51) Int. Cl.
*H01L 27/12*      (2006.01)
*H10K 59/131*   (2023.01)

(52) U.S. Cl.
CPC ......... *H01L 27/124* (2013.01); *H10K 59/131* (2023.02)

(58) Field of Classification Search
None
See application file for complete search history.

(56) References Cited

U.S. PATENT DOCUMENTS

| 2009/0153008 | A1  | 6/2009  | Yanagisawa et al. |
| 2015/0103267 | A1* | 4/2015  | Zhang ............... G06F 3/0412 349/12 |
| 2016/0097949 | A1  | 4/2016  | Nishino et al. |
| 2017/0154896 | A1* | 6/2017  | Li ......................... H01L 23/60 |
| 2017/0336688 | A1  | 11/2017 | Yamamoto et al. |

(Continued)

FOREIGN PATENT DOCUMENTS

| CN | 101464574 A | 6/2009 |
| CN | 102998820 A | 3/2013 |
| CN | 107003580 A | 8/2017 |

(Continued)

*Primary Examiner* — William C Trapanese
(74) *Attorney, Agent, or Firm* — IPro, PLLC

(57) ABSTRACT

Provided is an array substrate, including: a display region including signal lines and a peripheral region including a bonding region; wherein the bonding region includes at least one row of signal line input terminals disposed on a first substrate, the signal line input terminals being electrically connected to the signal lines; and the signal line input terminal includes an etched conductive layer, at least the etched conductive layers in two adjacent signal line input terminals disposed in a same row being disposed on different layers.

15 Claims, 7 Drawing Sheets

(56) References Cited

U.S. PATENT DOCUMENTS

2018/0108677 A1* 4/2018 Yeh .................... H01L 27/1262
2019/0018526 A1 1/2019 Fu et al.

FOREIGN PATENT DOCUMENTS

| CN | 108878444 A | 11/2018 |
| CN | 211506123 U | 9/2020 |
| WO | 2013099189 A1 | 7/2013 |

* cited by examiner

ARRAY SUBSTRATE, DISPLAY PANEL, AND DISPLAY DEVICE

This application is a US national stage of international application No. PCT/CN2020/134883, filed on Dec. 9, 2020, which claims priority to Chinese Patent Application No. 201922301533.4, filed on Dec. 19, 2019 and entitled "ARRAY SUBSTRATE, DISPLAY PANEL, AND DISPLAY DEVICE", the disclosures of which are herein incorporated by reference in their entireties.

TECHNICAL FIELD

The present disclosure relates to an array substrate, a display panel and a display device.

BACKGROUND

At present, with the continuous development of display technologies, high pixels per inch (PPI) display panels gradually enter the market.

SUMMARY

Embodiments of the present disclosure provide an array substrate, a display panel and a display device.

At least one embodiment of the present disclosure provides an array substrate. The array substrate includes a display region including signal lines and a peripheral region including a boding region; wherein the bonding region includes at least one row of signal line input terminals disposed on a first substrate, the signal line input terminals being electrically connected to the signal lines; and the signal line input terminal includes an etched conductive layer, at least the etched conductive layers in two adjacent signal line input terminals disposed in a same row being disposed on different layers.

In some embodiments, the signal line input terminal includes a single metal layer, and the etched conductive layer is the metal layer.

In some embodiments, the signal line input terminal includes a single metal layer and a single metal oxide layer, and the etched conductive layer is the metal layer.

In some embodiments, the bonding region includes at least two rows of the signal line input terminals.

In some embodiments, the array substrate further includes signal line leads disposed in the peripheral region; one end of each of the signal line leads is electrically connected to the signal line and the other end of each of the signal line leads is electrically connected to the signal line input terminal; and parts, proximal to the signal line input terminals, of two adjacent signal line leads are disposed on different layers.

In some embodiments, the signal line lead and at least the etched conductive layer in the signal line input terminal electrically connected to the signal line lead are disposed on different layers.

In some embodiments, where the bonding region includes at least two rows of the signal line input terminals, an orthogonal projection of the signal line lead electrically connected to a first signal line input terminal onto the first substrate falls between orthogonal projections of the two adjacent signal line input terminals in an adjacent row of signal line input terminals onto the first substrate, the first signal line input terminal being any one of one row of signal line input terminals and the adjacent rows of signal line input terminals being disposed between the first signal line input terminal and the display region.

In some embodiments, the bonding region includes three rows of the signal line input terminals, the signal line input terminals in a first row, the signal line input terminals in a second row and the signal line input terminals in a third row being arranged in sequence in a direction from the display region to the peripheral region; wherein a first signal line lead projection and a second signal line lead projection are respectively disposed on both sides of a center line of the orthogonal projection of the signal line input terminals in the second row onto the first substrate, the center line extending in the direction from the display region to the peripheral region, the first signal line lead projection being an orthogonal projection of the signal line lead electrically connected to the signal line input terminal in the second row onto the first substrate, and the second signal line lead projection being an orthogonal projection of the signal line lead electrically connected to the signal line input terminal in the third row onto the first substrate; wherein a spacing from the first signal line lead projection to the center line is less than a spacing from the first signal line lead projection to an orthogonal projection of the signal line input terminal in the first row, closest to the first signal line lead projection, onto the first substrate, and a spacing from the second signal line lead projection to the center line is less than a spacing from the second signal line lead projection to an orthogonal projection of the signal line input terminal in the first row, closest to the second signal line lead projection, onto the first substrate.

In some embodiments, the bonding region includes three rows of the signal line input terminals, the signal line input terminals in a first row, the signal line input terminals in a second row and the signal line input terminals in a third row being arranged in sequence in a direction from the display region to the peripheral region; wherein a first signal line lead projection and a second signal line lead projection are respectively disposed on both sides of a center line of the orthogonal projection of the signal line input terminals in the second row onto the first substrate, the center line extending in the direction from the display region to the peripheral region, the first signal line lead projection being an orthogonal projection of the signal line lead electrically connected to the signal line input terminal in the second row onto the first substrate, and the second signal line lead projection being an orthogonal projection of the signal line lead electrically connected to the signal line input terminal in the third row onto the first substrate; wherein a spacing between a third signal line lead projection and the first signal line lead projection is less than a spacing between the first signal line lead projection and the second signal line lead projection; and a spacing from the second signal line lead projection to an orthogonal projection of the signal line input terminal in the first row, closest to the second signal line lead projection, onto the first substrate is less than the spacing between the first signal line lead projection and the second signal line lead projection, the third signal line lead projection being an orthogonal projection of the signal line lead electrically connected to the signal line input terminal in the first row onto the first substrate.

In some embodiments, the array substrate further includes an anti-static wire; and each of the signal lines is electrically connected to the anti-static wire by at least one anti-static switch.

In some embodiments, the array substrate further includes a common electrode line; and the common electrode line is electrically connected to the anti-static wire by at least one anti-static switch.

In some embodiments, the signal line includes a plurality of first sub-signal lines arranged in a first direction and extending in a second direction, and a plurality of second sub-signal lines arranged in the second direction and extending in the first direction, the first direction being intersected with the second direction; and the signal line input terminal includes a first sub-signal line input terminal and a second sub-signal line input terminal, the first sub-signal line input terminal being electrically connected to the first sub-signal line and the second sub-signal line input terminal being electrically connected to the second sub-signal line.

In some embodiments, the first sub-signal line is a data line, and the second sub-signal line is a gate line; the first sub-signal line input terminal is a data line input terminal, and the second sub-signal line input terminal is a gate line input terminal; and the bonding region includes at least one of: at least two rows of data line input terminals and at least two rows of gate line input terminals.

At least one embodiment of the present disclosure provides a display panel, including the above array substrate.

At least one embodiment of the present disclosure provides a display device, including the above display panel and a driving circuit; wherein the signal line input terminal disposed in the bonding region of the display panel is bonded to the driving circuit.

In some embodiments, the driving circuit includes one of a chip and a flexible circuit board.

Reference Signs:

1-display panel; 2-chip (flexible circuit board); 01-display region; 02-peripheral region; 03-bonding region; 10-signal line input terminal; 11-array substrate; 12-cell alignment substrate 13-liquid crystal layer; 14-upper polarizer; 15-lower polarizer; 16-packaging layer; 20-signal line; 30-insulation layer; 40-signal line lead; 50-anti-static switch; 60-anti-static wire; 70-common electrode line; 101-first sub-signal line input terminal; 102-second sub-signal line input terminal; 110-first substrate; 111-thin film transistor; 112-pixel electrode; 113-common electrode; 114-first insulation layer; 115-second insulation layer; 116-anode; 117-light-emitting functional layer; 118-cathode; 119-pixel definition layer; 120-second substrate; 121-color filter layer; 122-black matrix pattern; 130-planarization layer; 201-first sub-signal line; 202-second sub-signal line.

DETAILED DESCRIPTION

The technical solutions in the embodiments of the present disclosure will be clearly and completely described below in reference with the accompanying drawings in the embodiments of the present disclosure. It is obvious that the described embodiments are only part but not all of the embodiments of the present disclosure. All other embodiments obtained by those skilled in the art without creative efforts based on the embodiments in the present disclosure are within the protection scope of the present disclosure.

The display panel includes a display region and a peripheral region. The peripheral region includes a bonding region. A signal line disposed in the display region is electrically connected to a signal line input terminal disposed in the bonding region, and the signal line input terminal is bonded to an electrode on a chip. The electrode on the chip provides a signal to the signal line input terminal, and then the signal is provided to the signal line.

However, for the high PPI display panels, since the number of pixels in the display panel increases, the number of required signal lines, such as gate lines and data lines, also increases.

Figure 1:
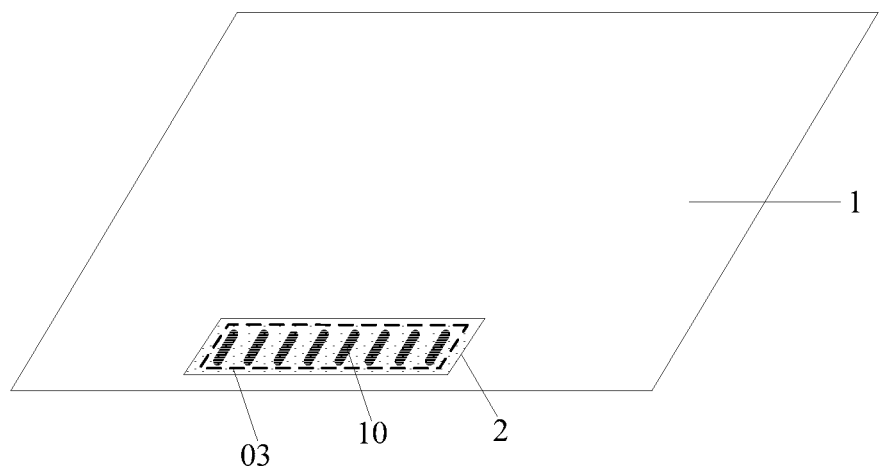
FIG. 1 is a schematic structural diagram of a display device according to an embodiment of the present disclosure.

The embodiment of the present disclosure provides a display device, which, as shown in FIG. 1, includes a display panel 1.

Figure 2:
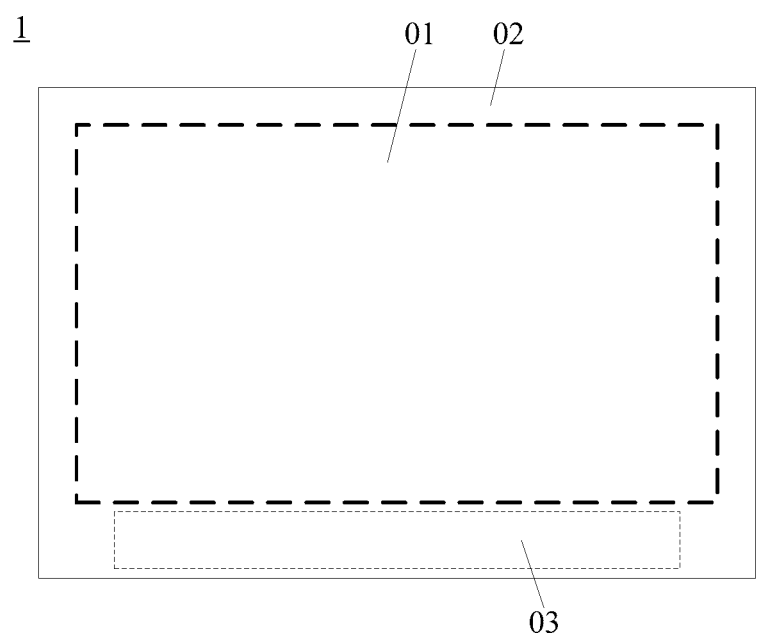
FIG. 2 is a schematic diagram of region division of a display panel according to an embodiment of the present disclosure.

As shown in FIG. 2, the display panel 1 includes a display region 01 and a peripheral region 02. The peripheral region 02 includes a bonding region 03.

As shown in FIG. 1, the display device further includes a driving circuit 2, and signal line input terminals 10 disposed in the bonding region 03 in the display panel 1 are bonded to the driving circuit 2.

In an exemplary embodiment, the driving circuit 2 may include a chip or a flexible printed circuit (FPC).

Here, the chip may be, for example, an integrated circuit (IC).

The chip or flexible circuit board is provided with electrodes corresponding to the signal line input terminals 10 disposed in the bonding region 03. The signal line input terminal 10 disposed in the bonding region 03 in the display panel 1 is bonded to the chip or flexible circuit board, that is, the signal line input terminal 10 is electrically connected to the corresponding electrode on the chip or flexible circuit board.

Since the signal line input terminal 10 disposed in the bonding region of the display panel 1 is bonded to the chip or flexible circuit board, the chip or flexible circuit board can provide a signal to the signal line input terminal 10 on the display panel 1.

The display device according to the embodiment of the present disclosure may be a liquid crystal display (LCD) or an electroluminescent display device. The electroluminescent display device may be an organic light-emitting diode (OLED) or quantum dot light-emitting diode (QLED) display device.

Figure 3:
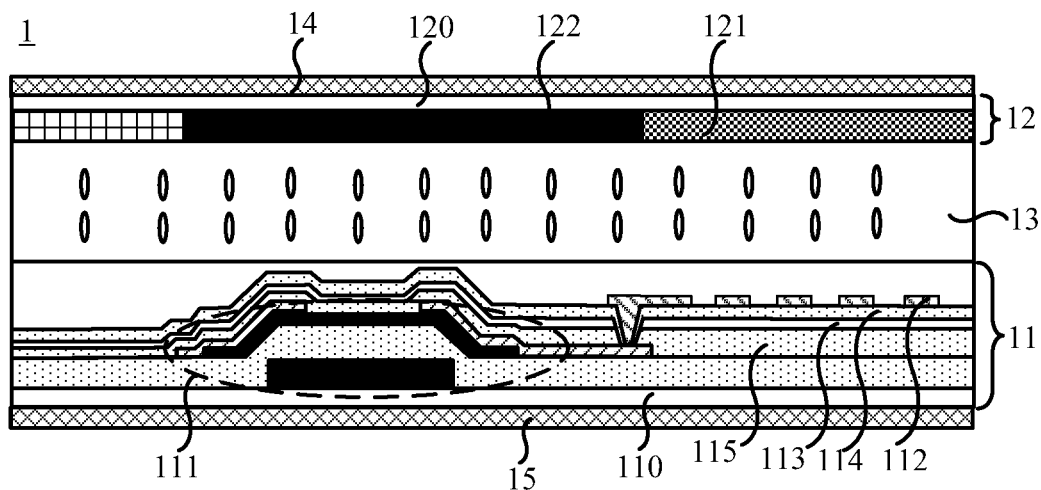
FIG. 3 is a schematic structural diagram of a liquid crystal display panel according to an embodiment of the present disclosure.

In the case where the display device is the liquid crystal display device, the display panel 1 is a liquid crystal display panel. As shown in FIG. 3, a main structure of the liquid crystal display panel includes an array substrate 11, a cell alignment substrate 12, and a liquid crystal layer 13 disposed between the array substrate 11 and the cell alignment substrate 12.

Each sub-pixel of the array substrate 11 is provided with a thin film transistor 111 and a pixel electrode 112 which are disposed on a first substrate 110. The thin film transistor 111 includes an active layer, a source electrode, a drain electrode, a gate electrode, and a gate insulation layer. The source electrode and the drain electrode are respectively in contact with the active layer, and the pixel electrode 112 is electrically connected to the drain electrode of the thin film transistor 111. In some embodiments, the array substrate 11 further includes a common electrode 113 disposed on the first substrate 110. The pixel electrode 112 and the common electrode 113 may be disposed on the same layer. In this case, each of the pixel electrode 112 and the common electrode 113 is a comb-tooth structure including a plurality of strip-shaped sub-electrodes. The pixel electrode 112 and the common electrode 113 may also be disposed on different layers. In this case, as shown in FIG. 3, a first insulation layer 114 is disposed between the pixel electrode 112 and the common electrode 113. In the case where the common electrode 113 is disposed between the thin film transistor 111 and the pixel electrode 112, as shown in FIG. 3, a second insulation layer 115 is further disposed between the common electrode 113 and the thin film transistor 111. In other embodiments, the cell alignment substrate 12 includes the common electrode 113.

As shown in FIG. 3, the cell alignment substrate 12 includes a color filter layer 121 disposed on a second substrate 120. In this case, the cell alignment substrate 12 may also be referred to as a color filter (CF). The color filter layer 121 at least includes a red photoresist unit, a green photoresist unit and a blue photoresist unit. The red photoresist unit, the green photoresist unit and the blue photoresist unit are respectively aligned with the sub-pixels on the array substrate 11. The cell alignment substrate 12 further includes a black matrix pattern 122 disposed on the second substrate 120, and the black matrix pattern 122 is configured to separate the red photoresist unit, the green photoresist unit, and the blue photoresist unit.

As shown in FIG. 3, the liquid crystal display panel further includes an upper polarizer 14 disposed on one side, distal from the liquid crystal layer 13, of the cell alignment substrate 12, and a lower polarizer 15 disposed on one side, distal from the liquid crystal layer 13, of the array substrate 11 away from.

Figure 4:
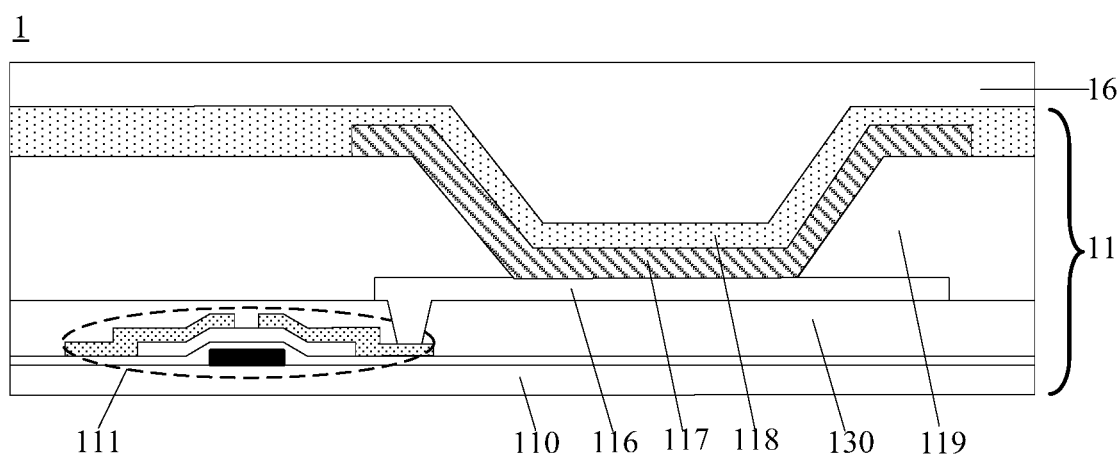
FIG. 4 is a schematic structural diagram of an electroluminescent display panel according to an embodiment of the present disclosure.

In the case where the display device is an electroluminescent display device, the display panel 1 is an electroluminescent display panel. As shown in FIG. 4, the electroluminescent display panel includes an array substrate 11 and a packaging layer 16 for packaging the array substrate 11. Here, the packaging layer 16 may be a packaging film or a packaging substrate.

As shown in FIG. 4, each sub-pixel of the above array substrate 11 includes a light-emitting device and a driving circuit which are disposed on the first substrate 110. The driving circuit includes a plurality of thin film transistors 111. The light-emitting device includes an anode 116, a light-emitting functional layer 117, and a cathode 118. The anode 116 is electrically connected to a drain electrode of the thin-film transistor 111 serving as a driving transistor in the plurality of thin-film transistors 111. The array substrate 11 further includes a pixel definition layer 119. The pixel definition layer 119 includes a plurality of opening areas, and one light-emitting device is disposed in one opening area. In some embodiments, the light-emitting functional layer 117 includes a light-emitting layer. In other embodiments, in addition to the light-emitting layer, the light-emitting functional layer 117 further includes one or more layers of an electron transporting layer (ETL), an electron injection layer (EIL), a hole transporting layer (HTL) and a hole injection layer (HIL).

As shown in FIG. 4, the array substrate 11 further includes a planarization layer 130 disposed between the thin film transistor 111 and the anode 116.

The electroluminescent display panel may be a top-emission display panel. In this case, the anode 116 proximal to the first substrate 110 is opaque, and the cathode 118 distal from the first substrate 110 is transparent or semi-transparent. The electroluminescent display panel may also be a bottom-emission display panel. In this case, the anode 116 proximal to the first substrate 110 is transparent or semi-transparent, and the cathode 118 distal from the first substrate 110 is opaque. The electroluminescent display panel may also be a double-sided emission display panel. In this case, the anode 116 proximal to the first substrate 110 and the cathode 118 distal from the first substrate 110 are both transparent or semi-transparent.

Figure 5:
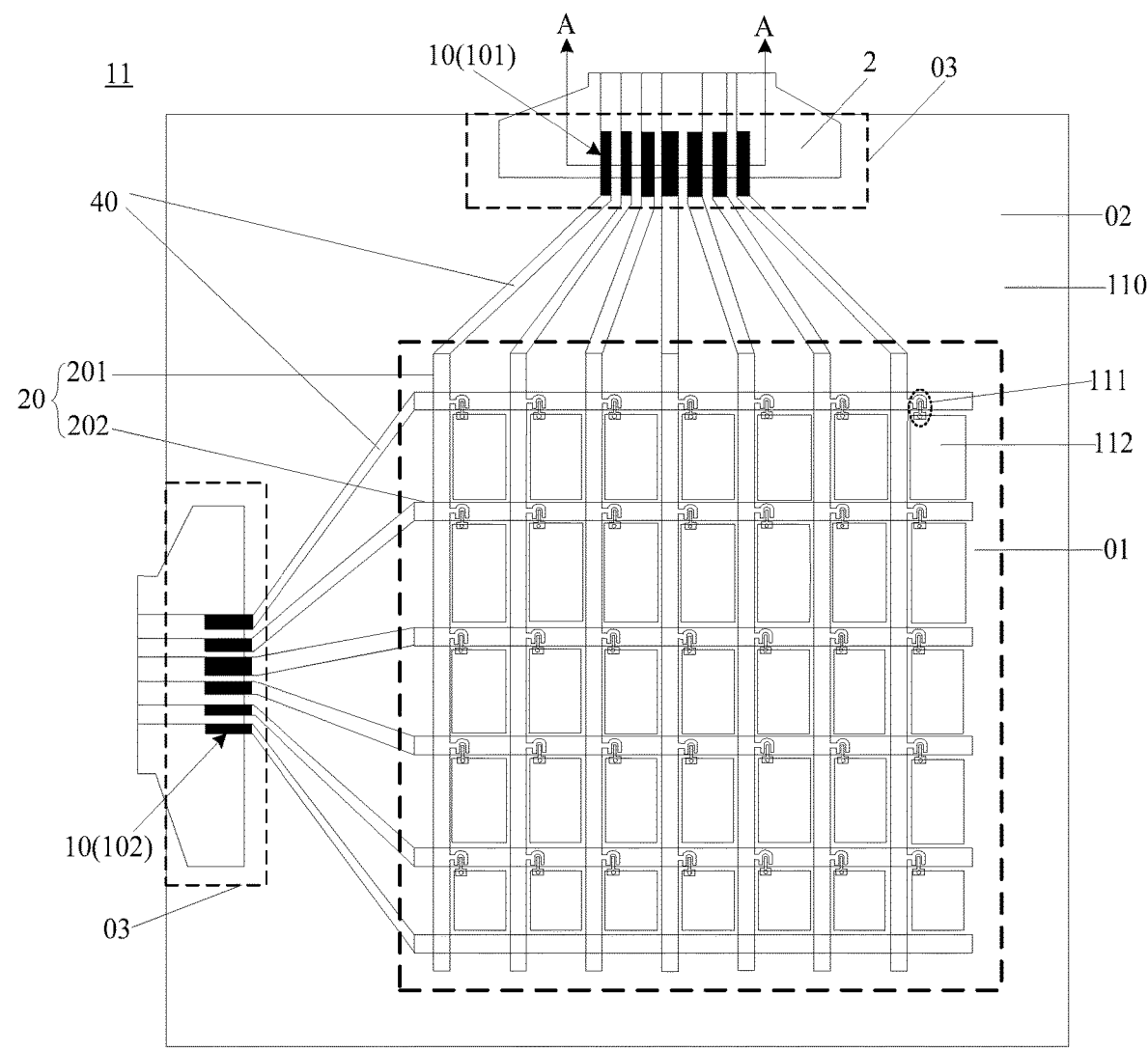
FIG. 5 is a schematic structural diagram of an array substrate according to an embodiment of the present disclosure.

The embodiment of the present disclosure also provides an array substrate 11, which may be applicable to the above display panel 1. As shown in FIG. 5, the display region 01 includes signal lines 20. The bonding region 03 includes at least one row of signal line input terminals 10 disposed on the first substrate 110, and the signal line input terminals 10 are electrically connected to the signal lines 20.

The signal line input terminal 10 includes an etched conductive layer. Here, the etched conductive layer refers to a conductive layer manufactured by an etching process, for example, a metal layer. That is, the signal line input terminal 10 includes at least one conductive layer, and the at least one conductive layer includes the etched conductive layer.

At least the etched conductive layers in the two adjacent signal line input terminals disposed in a same row are disposed on different layers.

The signal line input terminal 10 may only include the etched conductive layer, or may include the etched conductive layer and a non-etched conductive layer.

Figure 6:
FIG. 6 is a schematic cross-sectional view in direction AA in FIG. 5.

As shown in FIG. 6, the signal line input terminal 10 includes one conductive layer, which is the etched conductive layer. The etched conductive layers of the two adjacent signal line input terminals 10 in the same row are disposed on different layers. Or, the signal line input terminal 10 includes a plurality of conductive layers, at least one of which is the etched conductive layer. The etched conductive layers of the two adjacent signal line input terminals 10 in the same row are disposed on different layers.

For example, the signal line input terminal 10 includes a single metal layer, and the etched conductive layer is the metal layer.

For another example, the signal line input terminal 10 includes a single metal layer and a single metal oxide layer, and the etched conductive layer is the metal layer.

In other implementations, the signal line input terminal 10 may also include more conductive layers.

FIG. 5 illustrates an example in which the array substrate 11 is an array substrate applied to the above liquid crystal display panel.

FIG. 6 illustrates an example in which the signal line input terminal 10 includes one conductive layer. As shown in FIG. 6, the conductive layers disposed on different layers may be separated by an insulation layer 30.

It should be understood that the signal line input terminal 10 and the signal line 20 may be directly electrically connected together, or may also be electrically connected together through other auxiliary lines.

Here, the type of the signal line 20 and the arrangement of the signal line 20 are not limited. In some embodiments, as shown in FIG. 5, the signal line 20 includes a plurality of first sub-signal lines 201 arranged in a first direction and extending in a second direction, and a plurality of second sub-signal line 202 arranged in the second direction and extending in the first direction. The first direction is intersected with the second direction. In the case where the signal line 20 includes the first sub-signal lines 201 and the second sub-signal lines 202, the signal line input terminal 10 includes a first sub-signal line input terminal 101 and a second sub-signal line input terminal 102. The first sub-signal line input terminal 101 is electrically connected to the first sub-signal line 201, and the second sub-signal line input terminal 102 is electrically connected to the second sub-signal line 202.

In an exemplary embodiment, the first sub-signal line 201 may be a data line, the first sub-signal line input terminal 101 is a data line input terminal, the second sub-signal line 202 may be a gate line, and the second sub-signal line input terminal 102 is a gate line input terminal.

Based on the foregoing, those skilled in the art should understand that the signal line 20 includes, but not limited to, the data line and the gate line above, and may also be other types of signal lines, for example, a VDD signal line used in the electroluminescent display panel.

The conductive layer of the signal line input terminal 10 may be manufactured on the same layer as a film layer of the display region 01 of the array substrate 11, for example, manufactured on the same layer as a metal light-shielding layer disposed in the display region 01, or for another example, manufactured on the same layer as a line disposed in the display region 01. The conductive layer may also be manufactured separately instead of being manufactured on the same layer as the film layer of the display region 01 of the array substrate 11.

In the case where the signal line input terminal 10 includes a plurality of conductive layers, in addition to the metal layer, the plurality of conductive layers may also include a metal oxide layer in some embodiments. The metal oxide layer may be made of, for example, indium tin oxide (ITO), indium zinc oxide (IZO), indium gallium zinc oxide (IGZO), etc. Considering that a minimum etching spacing of the metal layer for a yield is large and the metal layer is easy to generate a short circuit defect in the etching process, thus, in the embodiment of the present disclosure, at least the metal layers in the two adjacent signal line input terminals 10 disposed in the same row are disposed on different layers. In addition, the metal layer may be made on the same layer as the metal light-shielding layer of the display region 01 in the array substrate 11. In this case, the metal layer is proximal to the first substrate 110 relative to other conductive layers in the signal line input terminal 10.

On this basis, those skilled in the art should understand that other layers, for example, the metal oxide layers, in the two adjacent signal line input terminals 10 disposed in the same row may also be disposed on different layers.

It should be understood that in the case where the signal line input terminal 10 includes one conductive layer, since the conductive layers of the two adjacent signal line input terminals 10 in the same row are disposed on different layers, a spacing between orthogonal projections of the conductive layers of the two adjacent signal line input terminals 10 on the first substrate 110 may be less than the minimum etching spacing for the yield. When the signal line input terminal 10 includes a plurality of conductive layers including the metal layers, since at least the metal layers of the two adjacent signal line input terminals 10 in the same row are disposed on different layers, a spacing between orthogonal projections of at least the metal layers of the two adjacent signal line input terminals 10 on the first substrate 110 may be less than the minimum etching spacing for the yield.

In the related art, the signal line input terminals 10 disposed in the same bonding region 03 are disposed in the same row and on the same layer, and for the display panel 1 of the same size, the size of the bonding region 03 and a minimum spacing between the adjacent signal line input terminals 10 is constant. Therefore, the number of the signal line input terminals 10 disposed in the same row in the bonding region 03 is constant. Since the number of pixels in a high PPI display panel increases, the number of the required signal lines 20, for example, gate lines and data lines, also increases. In order to ensure that signals can be provided to all signal lines 20, one signal line input terminal 10 needs to be electrically connected to a plurality of signal lines 20, so as to input the signals to the plurality of signal lines 20 by means of time sharing. As a result, a scanning frequency of the signal lines 20 is reduced, and a display effect is thus affected.

The embodiment of the present disclosure provides the array substrate 11. The display region 01 includes the signal lines 20. The bonding region 03 includes at least one row of signal line input terminals 10 disposed on the first substrate 110, and the signal line input terminals 10 are electrically connected to the signal lines 20. In the case where the signal line input terminal 10 includes one conductive layer, this conductive layer is the etched conductive layer. The conductive layers of the two adjacent signal line input terminals 10 in the same row are disposed on different layers, so the conductive layers can be prevented from a short circuit during an etching process. Therefore, the spacing between the two adjacent signal line input terminals 10 can be set to be smaller. In this way, for the bonding region 03 of the same size, the number of the disposed signal line input terminals 10 may be increased, thereby ensuring that one signal line input terminal 10 is electrically connected to one signal line 20. Or the number of the signal lines 20 electrically connected to each signal line input terminal 10 can be reduced relative to the related art, so as to improve the scanning frequency of the signal lines 20. In the case where the signal line input terminal 10 includes a plurality of conductive layers, and the plurality of conductive layers include the etched conductive layers. By taking the metal layer as an example of the etched conductive layer, the minimum etching spacing of the metal layer is relatively large. Therefore, the metal layers in the two adjacent signal line input terminals 10 in the same row are disposed on different layers, thereby preventing the metal layer from the short circuit defect during the etching process. In this way, the spacing between the metal layers in the two adjacent signal line input terminals 10 can be set to be smaller, such that the spacing between the two adjacent signal line input terminals 10 in the same row can be set to be smaller. Thus, for the bonding region 03 of the same size, the number of the signal line input terminals 10 may be increased, thereby ensuring that one signal line input terminal 10 is electrically connected to one signal line 20. Or, the number of the signal lines 20 electrically connected to each signal line input terminal 10 may be reduced relative to the related art, so as to improve the scanning frequency of the signal lines 20.

The number of rows of the signal line input terminals 10 disposed in the bonding region 03 is not limited, and may be set as required. In some embodiments, as shown in FIG. 5, the bonding region 03 includes one row of signal line input terminals 10. In other embodiments, as shown in FIG. 7 and FIG. 8, the bonding region 03 includes two or more rows of signal line input terminals 10, that is, the bonding region 03 includes at least two rows of signal line input terminals 10.

Figure 7:
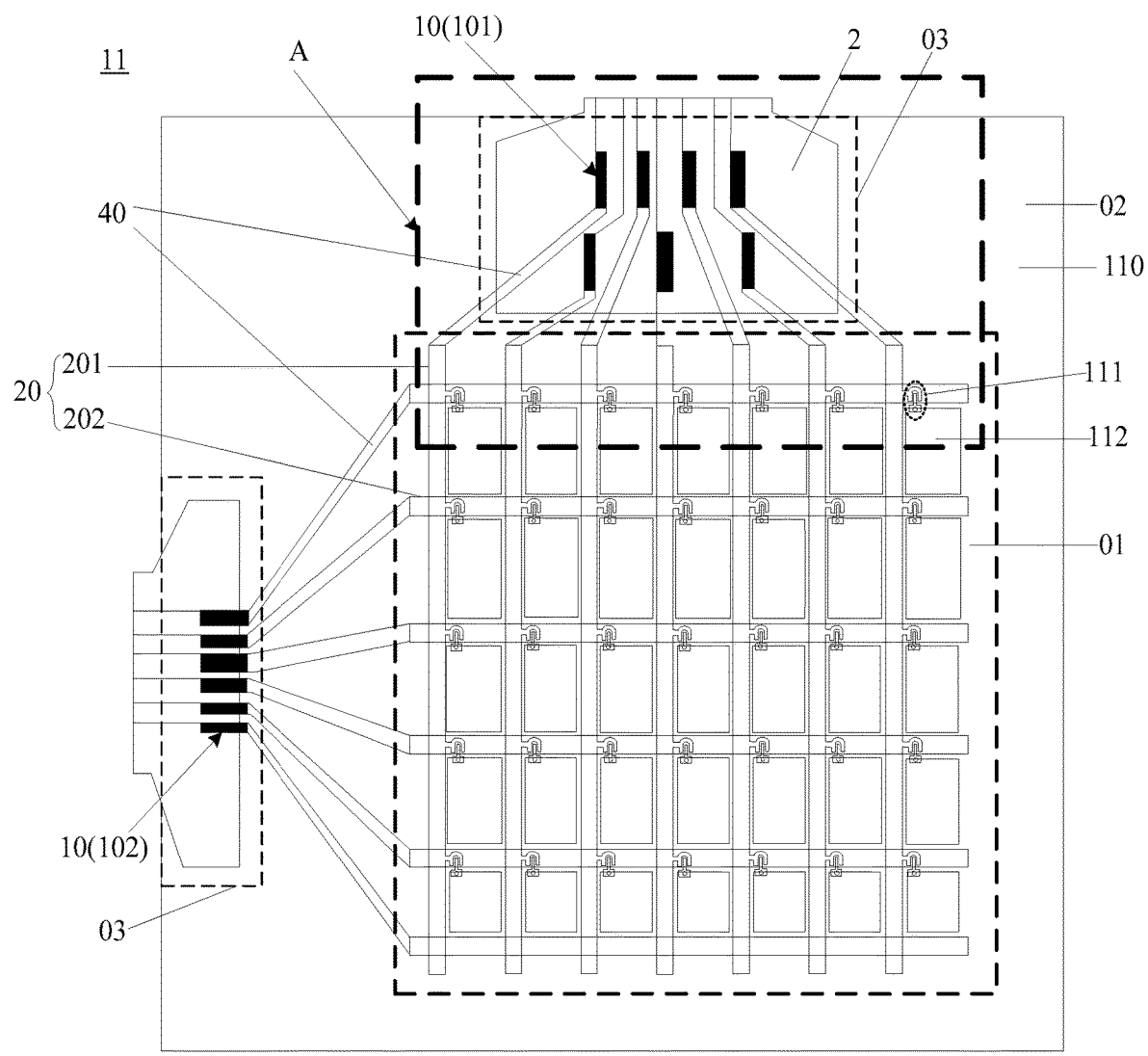
FIG. 7 is a schematic structural diagram of an array substrate according to another embodiment of the present disclosure.
Figure 8:
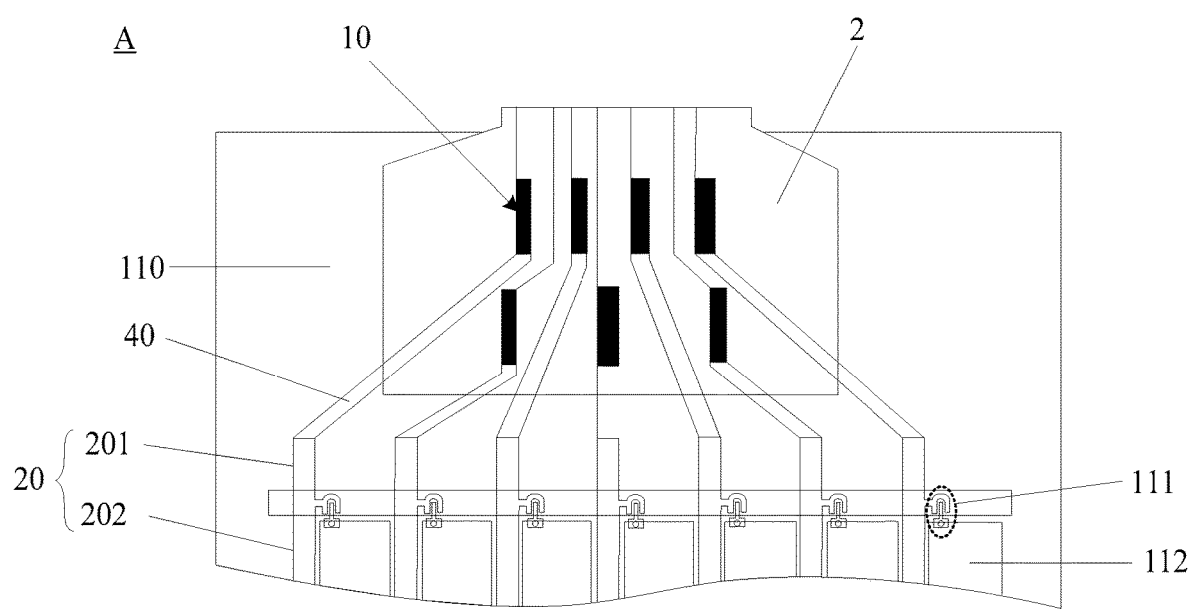
FIG. 8 is a partial enlarged schematic view of position A in FIG. 7.

FIG. 7 and FIG. 8 take the bonding region 03 including two rows of signal line input terminals 10 as an example for illustration. FIG. 8 is a partial enlarged schematic diagram of position A in FIG. 7.

It should be understood that in the case where the number of the signal line input terminals 10 disposed in the bonding region 03 is constant, the larger the number of rows of the signal line input terminals 10 disposed in the bonding region 03 is, the larger the spacing between the adjacent signal line input terminals 10 in the same row may be set. In this way, the conductive layers of the adjacent signal line input terminals 10 in the same row are further prevented from generating the short circuit defect in the etching process.

Here, in the case where the array substrate 11 includes a plurality of bonding regions 03, each bonding region 03 may include at least two rows of signal line input terminals 10. Or part of the bonding regions 03 may include at least two rows of signal line input terminals 10. In an exemplary embodiment, as shown in FIG. 7, the first sub-signal line input terminals (for example, the data line input terminals) 101 electrically connected to the first sub-signal lines (for example, the data lines) 201 are arranged in two rows in the bonding region 03, and the second sub-signal line input terminals (for example, the gate line input terminals) 102 electrically connected to the second sub-signal lines (for example, the gate lines) 202 are arranged in one row in the bonding region 03.

In the case where the signal lines 20 include the gate lines and the data lines, in some embodiments, the bonding region 03 includes at least two rows of data line input terminals; and/or, the bonding region 03 includes at least two rows of gate line input terminals.

In the embodiment of the present disclosure, the signal line input terminals 10 are arranged in at least two rows. On one hand, for the bonding region 03 of the same size, the number of the signal line input terminals 10 can be set to be larger, so as to adapt to display panels with higher resolution. On the other hand, the spacing between the adjacent signal line input terminals 10 in the same row can be set to be larger, to further prevent the adjacent signal line input terminals 10 from generating the short circuit defect during the etching process, thereby reducing a difficulty of manufacturing the signal line input terminals 10.

As shown in FIG. 5, FIG. 7 and FIG. 8, the array substrate 11 further includes signal line leads 40 disposed in the peripheral region 02. One end of each signal line lead 40 is electrically connected to the signal line 20, and the other end is electrically connected to the signal line input terminal 10.

Parts, proximal to the signal line input terminals 10, of the two adjacent signal line leads 40 are disposed on different layers.

It should be understood that the signal lines 20 of the same type on the array substrate 11 are disposed on the same layer. For example, all the data lines on the array substrate 11 are disposed on the same layer, and all the gate lines are disposed on the same layer. In some embodiments, the signal line lead 40 is electrically connected to the signal line 20 by means of via hole changeover.

Referring to FIG. 5 and FIG. 7, the signal line lead 40 extends in a direction that forms an acute angle with an extending line of the signal line 20.

Here, the signal line lead 40 and the signal line 20 which are electrically connected to each other may be manufactured on the same layer, or may be manufactured on different layers.

In the embodiment of the present disclosure, since the parts, proximal to the signal line input terminals 10, of the two adjacent signal line leads 40 are disposed on different layers, defects caused by the short circuit of the signal line leads 40 in the etching process are avoided.

In some embodiments, the signal line input terminal 10 includes a plurality of conductive layers, and the plurality of conductive layers include an etched conductive layer, for example, a metal layer. The signal line lead 40 and at least the etched conductive layer in the signal line input terminal 10 electrically connected to the signal line lead 40 are disposed on different layers.

In the embodiment of the present disclosure, the signal line input terminal 10 is formed by the plurality of conductive layers, which reduces a resistance of the signal line input terminal 10. In addition, the signal line lead 40 and at least one of the metal layers forming the signal line input terminal 10 electrically connected to the signal line lead 40 are disposed on different layers, which increases an invasion depth of conductive ions in an anisotropic conductive adhesive into the signal line input terminal 10 during crimping, and reduces a connection resistance.

An arrangement of the signal line leads 40 is not limited. In order to avoid the short circuit between different signal line leads 40 and simplify the arrangement of the signal line leads 40, in some embodiments, in the case where the bonding region 03 includes at least two rows of signal line input terminals 10, an orthogonal projection of the signal line lead 40 electrically connected to a first signal line input terminal onto the first substrate falls between orthogonal projections of the two adjacent signal line input terminals 10 in an adjacent row of signal line input terminals onto the first substrate. The first signal line input terminal is any one of one row of signal line input terminals 40, and the adjacent rows of the signal line input terminals 40 are disposed between the first signal line input terminal and the display region.

Figure 9:
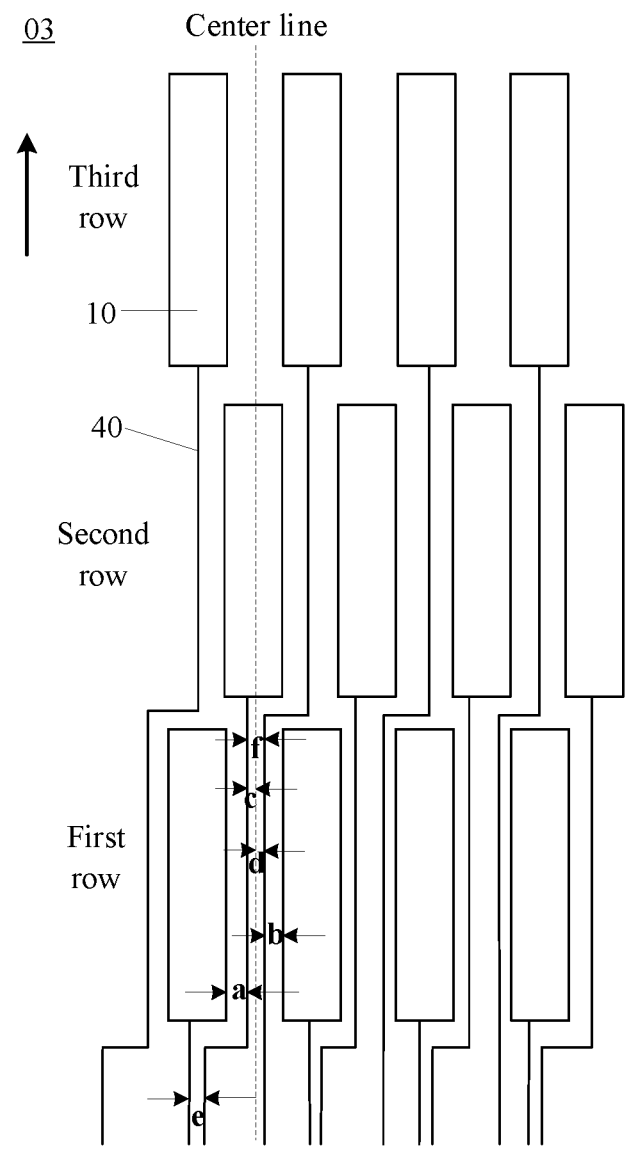
FIG. 9 is a schematic structural diagram of a bonding region according to an embodiment of the present disclosure.

On this basis, as shown in FIG. 9, the bonding region 03 includes three rows of signal line input terminals 10. In a direction from the display region 01 to the peripheral region 02 (the direction indicated by an arrow in FIG. 9), the signal line input terminals 10 in a first row, the signal line input terminals 10 in a second row, and the signal line input terminals 10 in a third row are arranged in sequence. The signal line leads 40 electrically connected to the signal line input terminals 10 in the second row and the signal line leads 40 electrically connected to the signal line input terminals 10 in the third row are respectively disposed on both sides of a center line (shown by a dashed line in FIG. 9) of the signal line input terminals 10 in the second row, and the center line extends in the direction from the display region 01 to the peripheral region 02. That is, a first signal line lead projection and a second signal line lead projection are respectively disposed on both sides of the center line of the orthogonal projection of the signal line input terminals 10 in the second row onto the first substrate. The first signal line lead projection is an orthogonal projection of the signal line lead 40 electrically connected to the signal line input terminal 10 in the second row onto the first substrate, and the second signal line lead projection is an orthogonal projection of the signal line lead 40 electrically connected to the signal line input terminal 10 in the third row onto the first substrate.

A spacing c from the signal line lead 40 electrically connected to the signal line input terminal 10 in the second row to the center line is less than a spacing a from the signal line lead 40 electrically connected to the signal line input terminal 10 in the second row to the signal line input terminal 10 in the first row closest to the signal line lead 40, and a spacing d from the signal line lead 40 electrically connected to the signal line input terminal 10 in the third row to the center line is less than a spacing b from the signal line lead 40 electrically connected to the signal line input terminal 10 in the third row to the signal line input terminal 10 in the first row closest to the signal line lead 40. That is, c is less than a, and d is less than b. That is, a spacing from the first signal line lead projection to the center line is less than a spacing from the first signal line lead projection to an orthogonal projection of the signal line input terminal 10 in the first row, closest to the first signal line lead projection, onto the first substrate, and a spacing from the second signal line lead projection to the center line is less than a spacing from the second signal line lead projection to an orthogonal projection of the signal line input terminal 10 in the first row, closest to the second signal line lead projection, onto the first substrate.

In some embodiments, the signal line lead 40 electrically connected to the signal line input terminal 10 in the third row and the signal line input terminal 10 in the first row closest to the signal line lead 40 electrically connected to the signal line input terminal 10 in the second row are disposed on a same layer. The signal line lead 40 electrically connected to the signal line input terminal 10 in the second row and the signal line input terminal 10 in the first row closest to the signal line lead 40 electrically connected to the signal line input terminal 10 in the third row are disposed on a same layer.

In the embodiment of the present disclosure, the bonding region 03 includes three rows of signal line input terminals 10. When the signal line leads 40 and the signal line input terminals 10 are designed, the spacing c from the signal line lead 40 electrically connected to the signal line input terminal 10 in the second row to the center line is less than the spacing a from the signal line lead 40 electrically connected to the signal line input terminal 10 in the second row to the signal line input terminal 10 in the first row closest to the signal line lead 40, and the spacing d from the signal line lead 40 electrically connected to the signal line input terminal 10 in the third row to the center line is less than the spacing b from the signal line lead 40 electrically connected to the signal line input terminal 10 in the third row to the signal line input terminal 10 in the first row closest to the signal line lead 40. In this way, the problem of a short circuit defect generated by the signal line leads 40 on the same layer during an etching process can be reduced.

In some embodiments, as shown in FIG. 9, the bonding region 03 includes three rows of signal line input terminals 10. In the direction from the display region 01 to the peripheral region 02, the signal line input terminals 10 in a first row, the signal line input terminals 10 in a second row and the signal line input terminals 10 in a third row are arranged in sequence. The signal line leads 40 electrically connected to the signal line input terminals 10 in the second row and the signal line leads 40 electrically connected to the signal line input terminals 10 in the third row are respectively disposed on both sides of a center line of the signal line input terminals 10 in the second row, and the center line extends in the direction from the display region 01 to the peripheral region 02. That is, a first signal line lead projection and a second signal line lead projection are respectively disposed on both sides of the center line of an orthogonal projection of the signal line input terminals 10 in the second row onto the first substrate.

A spacing e between the signal line lead 40 electrically connected to the signal line input terminal 10 in the first row and the signal line lead 40 electrically connected to the signal line input terminal 10 in the second row is less than a spacing f between the signal line lead 40 electrically connected to the signal line input terminal 10 in the second row and the signal line lead 40 electrically connected to the signal line input terminal 10 in the third row. Besides, the spacing b from the signal line lead 40 electrically connected to the signal line input terminal 10 in the third row to the signal line input terminal 10 in the first row closest to the signal line lead 40 is less than the spacing f between the signal line lead 40 electrically connected to the signal line input terminal 10 in the third row and the signal line lead 40 electrically connected to the signal line input terminal 10 in the second row. That is, e is less than f, and b is less than f. That is, the spacing between a third signal line lead projection and the first signal line lead projection is less than the spacing between the first signal line lead projection and the second signal line lead projection, and the spacing from the second signal line lead projection to the orthogonal projection of the signal line input terminal 10 in the first row, closest to the second signal line lead projection, onto the first substrate is less than the spacing between the second signal line lead projection and the first signal line lead projection. The third signal line lead projection is an orthogonal projection of the signal line lead 40 electrically connected to the signal line input terminal 10 in the first row onto the first substrate.

In the embodiment of the present disclosure, when the signal line leads 40 and the signal line input terminals 10 are designed, e is less than f and b is less than f. In this way, it can be ensured that a distance between the signal line leads 40 on the same layer is larger. The width of one signal line input terminal 10 is at least expanded between the signal line leads 40 on the same layer at positions between the signal line input terminals 10 and the display region 01.

Figure 10:
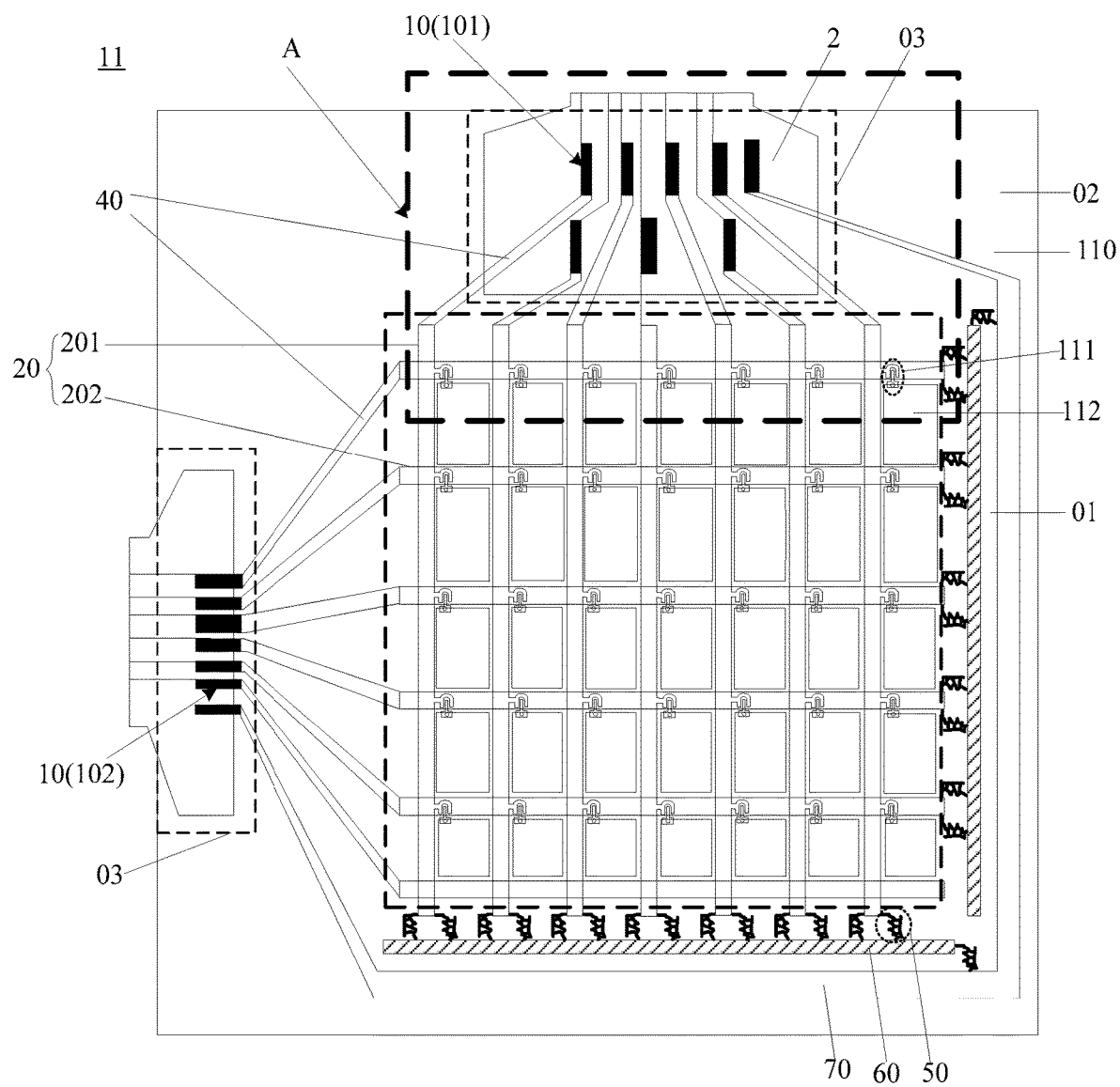
FIG. 10 is a schematic structural diagram of an array substrate according to still another embodiment of the present disclosure.

In some embodiments, as shown in FIG. 10, the array substrate 11 further includes an anti-static wire 60. Each signal line 20 is electrically connected to the anti-static wire 60 by at least one anti-static switch 50.

Here, each signal line 20 may be electrically connected to the anti-static wire 60 by one anti-static switch 50, and may also be electrically connected to the anti-static wire 60 by two or more anti-static switches 50. In some embodiments, as shown in FIG. 10, each signal line 20 is electrically connected to the anti-static wire 60 by two anti-static switches 50.

In the case where the signal line 20 include the data line and the gate line. Each data line is electrically connected to the anti-static wire 60 by at least one anti-static switch 50, and each gate line is electrically connected to the anti-static wire 60 by at least one anti-static switch 50.

In the embodiment of the present disclosure, the anti-static wire 60 is disposed, and the signal line 20 is electrically connected to the anti-static wire 60 by the anti-static switch 50, such that static electricity on the signal line 20 can be led to the anti-static wire 60 to prevent the signal line 20 from being disconnected due to electrostatic breakdown.

In some embodiments, as shown in FIG. 10, the array substrate 11 further includes a common electrode line 70. The common electrode line 70 is electrically connected to the anti-static wire 60 by at least one anti-static switch 50.

Here, the common electrode line 70 may be electrically connected to the anti-static wire 60 by one anti-static switch 50, or may be electrically connected to the anti-static wire 60 by two or more anti-static switches 50.

In the embodiment of the present disclosure, by electrically connecting the common electrode line 70 and the anti-static wire 60, the static electricity on the common electrode line 70 can be led to the anti-static wire 60, thereby preventing the common electrode line 70 from being disconnected due to electrostatic breakdown.

Described above are merely specific implementations of the present disclosure, but the protection scope of the present disclosure is not limited thereto. Variation or substitutions that are readily conceivable by those skilled in the art within the technical scope of the present disclosure should fall within the protection scope of the present disclosure. Therefore, the protection scope of the present disclosure shall be subject to the protection scope defined by the claims.

What is claimed is:

1. An array substrate, comprising: a display region comprising signal lines, a peripheral region comprising a bonding region, and signal line leads disposed in the peripheral region; wherein
the bonding region comprises at least two rows of signal line input terminals disposed on a first substrate, the signal line input terminals being electrically connected to the signal lines;
the signal line input terminal comprises an etched conductive layer, at least the etched conductive layers in two adjacent signal line input terminals disposed in a same row being disposed on different layers; and
one end of each of the signal line leads is electrically connected to the signal line and the other end of each of the signal line leads is electrically connected to the signal line input terminal; parts, proximal to the signal line input terminals, of two adjacent signal line leads are disposed on different layers; and an orthogonal projection of the signal line lead electrically connected to a first signal line input terminal onto the first substrate falls between orthogonal projections of the two adjacent signal line input terminals in an adjacent row of signal line input terminals onto the first substrate, wherein the first signal line input terminal being any one of one row of signal line input terminals and the adjacent rows of signal line input terminals being disposed between the first signal line input terminal and the display region.

2. The array substrate according to claim 1, wherein the signal line input terminal comprises a single metal layer, and the etched conductive layer is the metal layer.

3. The array substrate according to claim 1, wherein the signal line input terminal comprises a single metal layer and a single metal oxide layer, and the etched conductive layer is the metal layer.

4. The array substrate according to claim 1, wherein the signal line lead and at least the etched conductive layer in the signal line input terminal electrically connected to the signal line lead are disposed on different layers.

5. The array substrate according to claim 1, wherein the bonding region comprises three rows of the signal line input terminals, the signal line input terminals in a first row, the signal line input terminals in a second row and the signal line input terminals in a third row being arranged in sequence in a direction from the display region to the peripheral region; wherein
a first signal line lead projection and a second signal line lead projection are respectively disposed on both sides of a center line of the orthogonal projection of the signal line input terminals in the second row onto the first substrate, the center line extending in the direction from the display region to the peripheral region, the first signal line lead projection being an orthogonal projection of the signal line lead electrically connected to the signal line input terminal in the second row onto the first substrate, and the second signal line lead projection being an orthogonal projection of the signal line lead electrically connected to the signal line input terminal in the third row onto the first substrate;
wherein a spacing from the first signal line lead projection to the center line is less than a spacing from the first signal line lead projection to an orthogonal projection of the signal line input terminal in the first row, closest to the first signal line lead projection, onto the first substrate, and a spacing from the second signal line lead projection to the center line is less than a spacing from the second signal line lead projection to an orthogonal projection of the signal line input terminal in the first row, closest to the second signal line lead projection, onto the first substrate.

6. The array substrate according to claim 1, wherein the bonding region comprises three rows of the signal line input terminals, the signal line input terminals in a first row, the signal line input terminals in a second row and the signal line input terminals in a third row being arranged in sequence in a direction from the display region to the peripheral region; wherein
a first signal line lead projection and a second signal line lead projection are respectively disposed on both sides of a center line of the orthogonal projection of the signal line input terminals in the second row onto the first substrate, the center line extending in the direction from the display region to the peripheral region, the first signal line lead projection being an orthogonal projection of the signal line lead electrically connected to the signal line input terminal in the second row onto the first substrate, and the second signal line lead projection being an orthogonal projection of the signal line lead electrically connected to the signal line input terminal in the third row onto the first substrate;
wherein a spacing between a third signal line lead projection and the first signal line lead projection is less than a spacing between the first signal line lead projection and the second signal line lead projection; and a spacing from the second signal line lead projection to an orthogonal projection of the signal line input terminal in the first row, closest to the second signal line lead projection, onto the first substrate is less than the spacing between the first signal line lead projection and the second signal line lead projection, the third signal line lead projection being an orthogonal projection of the signal line lead electrically connected to the signal line input terminal in the first row onto the first substrate.

7. The array substrate according to claim 1, further comprising: an anti-static wire; and each of the signal lines is electrically connected to the anti-static wire by at least one anti-static switch.

8. The array substrate according to claim 7, wherein the array substrate further comprises a common electrode line;
wherein the common electrode line is electrically connected to the anti-static wire by at least one anti-static switch.

9. The array substrate according to claim 1, wherein the signal line comprises a plurality of first sub-signal lines arranged in a first direction and extending in a second direction, and a plurality of second sub-signal lines arranged in the second direction and extending in the first direction, the first direction being intersected with the second direction; and
the signal line input terminal comprises a first sub-signal line input terminal and a second sub-signal line input terminal, the first sub-signal line input terminal being electrically connected to the first sub-signal line and the second sub-signal line input terminal being electrically connected to the second sub-signal line.

10. The array substrate according to claim 9, wherein
the first sub-signal line is a data line, and the second sub-signal line is a gate line;
the first sub-signal line input terminal is a data line input terminal, and the second sub-signal line input terminal is a gate line input terminal; and
the bonding region comprises at least one of:
at least two rows of data line input terminals and at least two rows of gate line input terminals.

11. A display panel comprising an array substrate, wherein the array substrate comprises a display region comprising signal lines, a peripheral region comprising a bonding region, and signal line leads disposed in the peripheral region; wherein
the bonding region comprises at least one row of signal line input terminals disposed on a first substrate, the signal line input terminals being electrically connected to the signal lines;
the signal line input terminal comprises an etched conductive layer, at least the etched conductive layers in two adjacent signal line input terminals disposed in a same row being disposed on different layers; and
one end of each of the signal line leads is electrically connected to the signal line and the other end of each of the signal line leads is electrically connected to the signal line input terminal; parts, proximal to the signal line input terminals, of two adjacent signal line leads are disposed on different layers; and an orthogonal projection of the signal line lead electrically connected to a first signal line input terminal onto the first substrate falls between orthogonal projections of the two adjacent signal line input terminals in an adjacent row of signal line input terminals onto the first substrate, wherein the first signal line input terminal being any one of one row of signal line input terminals and the adjacent rows of signal line input terminals being disposed between the first signal line input terminal and the display region.

12. A display device comprising a display panel and a driving circuit, wherein the display panel comprises an array substrate, and the array substrate comprises a display region comprising signal lines, a peripheral region comprising a bonding region, and signal line leads disposed in the peripheral region; wherein the bonding region comprises at least two rows of signal line input terminals disposed on a first substrate, the signal line input terminals being electrically connected to the signal lines; the signal line input terminal comprises an etched conductive layer, at least the etched conductive layers in two adjacent signal line input terminals disposed in a same row being disposed on different layers; and one end of each of the signal line leads is electrically connected to the signal line and the other end of each of the signal line leads is electrically connected to the signal line input terminal; parts, proximal to the signal line input terminals, of two adjacent signal line leads are disposed on different layers; and an orthogonal projection of the signal line lead electrically connected to a first signal line input terminal onto the first substrate falls between orthogonal projections of the two adjacent signal line input terminals in an adjacent row of signal line input terminals onto the first substrate, wherein the first signal line input terminal being any one of one row of signal line input terminals and the adjacent rows of signal line input terminals being disposed between the first signal line input terminal and the display region; and
the signal line input terminal disposed in the bonding region of the display panel is bonded to the driving circuit.

13. The display device according to claim 12, wherein the driving circuit comprises one of a chip and a flexible circuit board.

14. The display panel according to claim 11, wherein the signal line input terminal comprises a single metal layer, and the etched conductive layer is the metal layer.

15. The display panel according to claim 11, wherein the signal line input terminal comprises a single metal layer and a single metal oxide layer, and the etched conductive layer is the metal layer.

* * * * *